United States Patent
Okuda et al.

(10) Patent No.: US 8,013,306 B2
(45) Date of Patent: Sep. 6, 2011

(54) SINGLE CRYSTAL SCINTILLATOR MATERIAL AND METHOD FOR PRODUCING THE SAME

(75) Inventors: Hiroyuki Okuda, Osaka (JP); Naoyuki Okamoto, Osaka (JP)

(73) Assignee: Hitachi Metals, Ltd., Tokyo (JP)

(*) Notice: Subject to any disclaimer, the term of this patent is extended or adjusted under 35 U.S.C. 154(b) by 119 days.

(21) Appl. No.: 12/664,928

(22) PCT Filed: Jul. 1, 2008

(86) PCT No.: PCT/JP2008/001717
§ 371 (c)(1),
(2), (4) Date: Dec. 16, 2009

(87) PCT Pub. No.: WO2009/004791
PCT Pub. Date: Jan. 8, 2009

(65) Prior Publication Data
US 2010/0207029 A1    Aug. 19, 2010

(30) Foreign Application Priority Data

Jul. 3, 2007 (JP) ................................. 2007-175264
Apr. 4, 2008 (JP) ................................. 2008-097786

(51) Int. Cl.
*G01T 1/164* (2006.01)
(52) U.S. Cl. .................. 250/363.03; 252/301.4 R
(58) Field of Classification Search ............ 250/363.03; 252/301.4 R
See application file for complete search history.

(56) References Cited

U.S. PATENT DOCUMENTS

| | | | |
|---|---|---|---|
| 7,227,157 B2 | 6/2007 | Nakatsu | |
| 2003/0159643 A1 | 8/2003 | Sumiya et al. | |
| 2005/0022721 A1* | 2/2005 | Kolis | 117/11 |
| 2005/0236582 A1* | 10/2005 | Nakatsu | 250/484.4 |

FOREIGN PATENT DOCUMENTS

| | | |
|---|---|---|
| JP | 59-141495 A | 8/1984 |
| JP | 09-048697 A | 2/1997 |
| JP | 2000-335999 A | 12/2000 |
| JP | 2006-052372 A | 2/2006 |
| JP | 2006052372 A * | 2/2006 |
| JP | 2006-193630 A | 7/2006 |
| JP | 2009046598 A * | 3/2009 |
| WO | 2007/099772 A1 | 9/2007 |

OTHER PUBLICATIONS

Salley et al., "Optical Properties of Cerium Doped Lutetium Borates: Characterization of Novel scintillators." Mar. 1997, American Physical Society, Annual March Meeting, Abstract.*
Wu et al., "Research on phase transition behavior of Lutetium orthoborate LuBO3." Feb. 2011, vol. 84, abstract.*
Weber et al., "Dense Ce3+- Activated Scintillator Materials." 1995, SCINT, pp. 1-5.*

(Continued)

*Primary Examiner* — David Porta
*Assistant Examiner* — Christine Sung
(74) *Attorney, Agent, or Firm* — Keating & Bennett, LLP

(57) ABSTRACT

A single crystal scintillator material according to the present invention includes a single crystal portion that is represented by the compositional formula $(Ce_xLu_{1-x})BO_3$ in which the mole fraction x of Ce satisfies $0.0001 \leq x \leq 0.05$.

10 Claims, 5 Drawing Sheets

OTHER PUBLICATIONS

Blcerzyk et al., "Future hosts for fast and high light output cerium doped scintillator." 2000, Journal of Luminescence, vols. 87-89, pp. 963-966.*

Hatamoto et al., "Growth and Scintillation properties of cerium doped lutetium scandium borate single crystals." Journal of Crystal Growth, vol. 311, pp. 530-533.*

Spassky et al., "Luminescence Study of the Gadolinium and Lutecium Borates and Phosphates dope with Ce3+ and Tb3+." Jul. 12-17, 2009, 7th International Conference on Luminescence Detectors and Transformers of Ionizing radiation, pp. 1-2.*

Mansuy et al., "Characterization of sol-gel derived scintillating LuBO3 films doped with rare earth ions." 2006, Journal of Thin Solid Films, vol. 515, pp. 666-669.*

Official Communication issued in International Patent Application No. PCT/JP2008/001717, mailed on Oct. 14, 2008.

English translation of Official Communication issued in corresponding International Application PCT/JP2008/001717, mailed on Feb. 4, 2010.

* cited by examiner

SINGLE CRYSTAL SCINTILLATOR MATERIAL AND METHOD FOR PRODUCING THE SAME

TECHNICAL FIELD

The present invention relates to a single crystal scintillator material for use in a positron emission tomography scanner and a method of making such a material.

BACKGROUND ART

Recently, in the field of medical care, diagnosis using a positron emission tomography (which will be abbreviated herein as "PET") scanner has been carried out more and more often. Thus, to realize a PET scanner with even higher performance, searches for better scintillator materials have been conducted.

The scintillator materials for use to make a PET scanner need to detect a γ ray. To meet those needs, single crystal scintillator materials, including BGO (bismuth germanium oxide), LSO (lutetium silicon oxide), and GSO (gadolinium silicon oxide), have been used so far to make a PET scanner. The properties of a scintillator material are evaluated by its fluorescence output, fluorescence decay time, and energy resolution, for example. All of the single crystal materials mentioned above have properties that are good enough to use them to make a PET scanner. And as for a method of growing such a single crystal, a melt growth process such a Czochralski process or a Bridgman process has been used extensively on an industrial basis.

To make the PET more popular, however, the throughput of the diagnosis should be increased. But the throughput cannot be increased unless a single crystal scintillator material, of which the intensity of emission is greater than, but the fluorescence decay time is shorter than, conventional scintillator materials, is developed.

Patent Document No. 1 discloses GSO activated with a dopant Ce (cerium). On the other hand, Patent Documents Nos. 2 and 3 disclose cerium doped lutetium borate materials. Cerium doped lutetium borate has a high intensity of emission and a short fluorescence decay time, and therefore, is regarded as a promising scintillator material. Patent Document No. 3 also suggests that the cerium doped lutetium borate material be applied to the field of PET. However, the cerium doped lutetium borate material disclosed in that document is just powder. Thus, nobody has ever reported a technique for forming a single crystal of cerium doped lutetium borate that is big enough to use it in the PET.

As for lutetium borate, its phase transition point (of about 1,350° C.) that involves a significant volumetric change is located in a lower temperature range than its melting point (of 1,650° C.). That is why according to a conventional single crystal growing process, in which the starting material should be heated to a temperature that is high enough to melt or dissolve the material, when the melt being cooled passes the phase transition point, its volume will expand so much that the crystal will collapse, which is a serious problem. For that reason, it has been impossible to produce a single crystal of cerium doped lutetium borate according to the conventional method. And nobody has ever reported that they succeeded in making a single crystal of cerium doped lutetium borate, of which the properties are good enough to use it to make a PET scanner.

On top of that, what is realized by Patent Documents Nos. 2 and 3 is either powder or a tablet obtained by compacting a dry mixture and baking the compact.

Other materials such as $LaBr_3$ have also been proposed. However, all of those alternative materials have some problem in terms of their chemical stability or density. Therefore, it is sad to say that a perfect single crystal scintillator material that will satisfy all of those requirements has never been reported so far.

Patent Document No. 1: Japanese Patent Application Laid-Open Publication No. 2003-300795

Patent Document No. 2: Japanese Patent Application Laid-Open Publication No. 2005-298678

Patent Document No. 3: Japanese Patent Application Laid-Open Publication No. 2006-52372

DISCLOSURE OF INVENTION

Problems to be Solved by the Invention

It is therefore an object of the present invention to provide a single crystal scintillator material with sufficiently high intensity of emission and good enough fluorescence decay properties and a method of making such a material.

Means for Solving the Problems

A single crystal scintillator material according to the present invention includes a single crystal portion that is represented by the compositional formula $(Ce_xLu_{1-x})BO_3$ in which the mole fraction x of Ce satisfies $0.0001 \leq x \leq 0.05$.

In one preferred embodiment, the single crystal portion has a calcite type crystal structure.

In another preferred embodiment, the single crystal portion has a diagonal size of at least 3 mm and a thickness of at least 0.5 mm.

In still another preferred embodiment, the single crystal portion has a weight of at least 5 mg.

In this particular preferred embodiment, the single crystal portion has a weight of 500 mg or more.

A method of making a single crystal scintillator material according to the present invention includes the steps of: mixing a Ce compound and a Lu compound in a solvent, which includes lead borate as main component, so that the concentration of the compounds becomes equal to or higher than the saturation concentration of the solvent and then heating the mixture to a temperature of 800° C., to 1,350° C., thereby dissolving the compounds; and growing and depositing a single crystal by cooling the compounds dissolved. The single crystal is represented by the compositional formula $(Ce_xLu_{1-x})BO_3$, in which the mole fraction x of Ce satisfies $0.0001 \leq x \leq 0.05$.

In one preferred embodiment, the step of growing and depositing the single crystal is performed by TSSG process.

In another preferred embodiment, the step of growing and depositing the single crystal includes cooling the mixture at a temperature decrease rate of 0.001° C. per hour to 5° C. per hour until the temperature of the compounds reaches the range of 750° C. to 1,250° C.

In still another preferred embodiment, the single crystal is grown to have a diagonal size of at least 3 mm and a thickness of at least 0.5 mm.

A positron emission tomography scanner according to the present invention includes a scintillator made of a single crystal scintillator material according to any of the preferred embodiments of the present invention described above.

Effects of the Invention

The present invention provides a single crystal scintillator material with sufficiently high intensity of emission and good enough fluorescence decay properties.

DESCRIPTION OF REFERENCE NUMERALS

Figure 1:
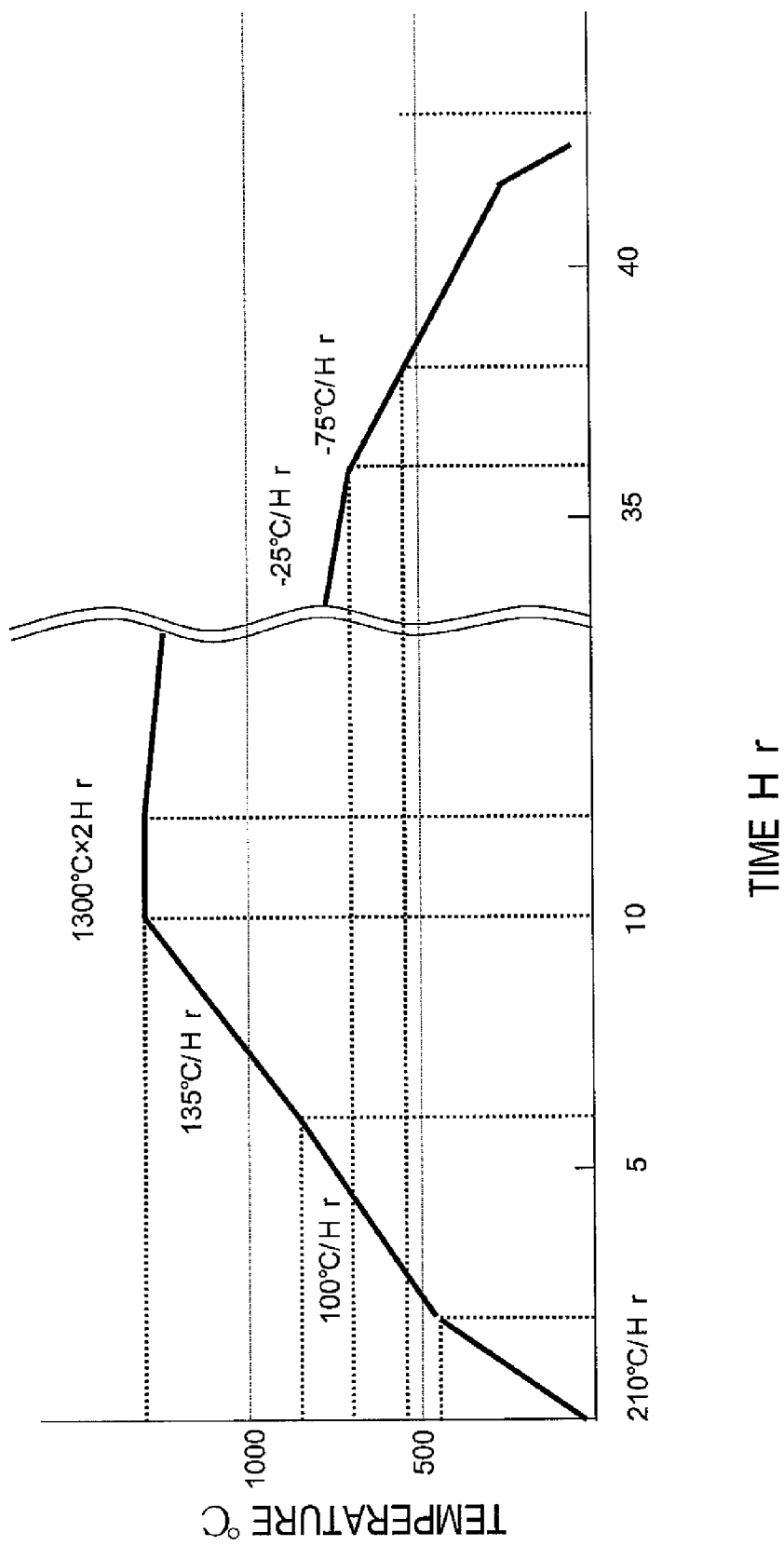
FIG. 1 is a graph showing a heat pattern for growing a crystal according to a first specific example of the present invention.

| | |
|---|---|
| 1 | crucible |
| 2 | heater |
| 3 | electric furnace |
| 4 | crucible susceptor |
| 5 | seed shaft |
| 6 | seed material |
| 7 | molten material |

BEST MODE FOR CARRYING OUT THE INVENTION

A single crystal scintillator material according to the present invention includes a single crystal portion that is represented by the compositional formula $(Ce_xLu_{1-x})BO_3$ in which the mole fraction x of Ce satisfies $0.0001 \leq x \leq 0.05$. In one preferred embodiment, the single crystal portion has a diagonal size of at least 3 mm and a thickness of at least 0.5 mm. As used herein, the "diagonal size" refers to the maximum size of the single crystal portion, while the "thickness" refers to the minimum size of the single crystal portion. According to the present invention, the single crystal portion that has been grown and deposited typically has a roughly flat plate shape but may also be turned into any other shape.

It should be noted that typically all of the single crystal scintillator material of the present invention consists of the "single crystal portion". However, the single crystal scintillator material of the present invention could also include a non-single crystal portion (such as a polycrystalline portion) or could be covered with a protective coating, for example.

It has been known in the art that lutetium borate activated with a rare-earth element as a dopant will exhibit scintillation property (i.e., will absorb a radiation such as an X-ray and emit an ultraviolet ray or a visible ray). Among other things, Ce-doped lutetium borate can be a very good scintillator material because it has a high intensity of emission and a short fluorescence decay time.

The single crystal scintillator material of the present invention has a diagonal size of at least 3 mm, a thickness of at least 0.5 mm and a weight of at least 5 mg, and preferably 50 mg or more, and therefore, can be used effectively as a scintillator in PET. According to none of the conventional processes, a single crystal of lutetium borate can be made so as to have such big sizes. However, such a big single crystal could be made successfully for the first time by the manufacturing process of the present invention to be described later.

In the compositional formula described above, the mole fraction x represents the percentage of Ce that should replace the Lu sites. If the mole fraction x were less than 0.0001, the percentage of the emissive element Ce would be too small to produce emission with sufficient intensity. On the other hand, if the mole fraction x were greater than 0.05, then the transmittance would decrease so much as to decrease the intensity of the emission produced, too.

In a preferred embodiment of the present invention, the single crystal scintillator material is doped with Ce substantially uniformly over the entire single crystal and satisfies the mole fraction range described above in each and every region of each single crystal. As a result, the entire single crystal can have a desired dopant Ce concentration and can exhibit good fluorescence decay properties.

The single crystal of lutetium borate has a calcite structure in a temperature range that is lower than a phase transition point of around 1,350° C., but has a vaterite structure at temperatures exceeding the phase transition point. As will be described later, according to the present invention, a single crystal is grown and deposited by dissolving the material at a temperature of 1,350° C. or less and then cooling the material dissolved, and therefore, no significant volumetric change should occur due to a phase transition during the cooling process. As a result, the single crystal of lutetium borate with the calcite structure can be grown thickly.

The single crystal scintillator material of the present invention thus prepared has high transmittance with respect to visible radiation. For example, a single crystal with a thickness of 2 mm or less will have as high a transmittance as 50% or more at a peak of its emission wavelength. A peak value of the emission wavelength will vary according to the composition of the single crystal. As for a single crystal of Ce-doped lutetium borate that satisfies the mole fraction range described above, a peak of its emission wavelength will fall within the range of 350 nm to 450 nm.

Hereinafter, it will be described exactly how to make the single crystal scintillator material of the present invention.

As described above, the single crystal of lutetium borate has a vaterite structure at temperatures exceeding a phase transition point of around 1,350° C. but has a calcite structure in a temperature range that is lower than the phase transition point. According to the conventional single crystal growing process, the material needs to be heated to such a high temperature that the temperature of a crystal that has been deposited by cooling the melt will inevitably pass that phase transition point during the cooling process. As a result, the volume of that crystal deposited will change significantly as a result of phase transition and the crystal will collapse. That is why it has been very difficult to make a single crystal of lutetium borate having a phase transition point that is lower than its melting point.

However, the present inventors discovered that by dissolving a lutetium borate based material at a temperature lower than the phase transition point using lead borate as a main solvent and then by gradually cooling the dissolved material, a single crystal of cerium doped lutetium borate can be deposited.

Specifically, starting materials, including a lead compound, a boron compound, a Ce compound and a Lu compound, are mixed together at a predetermined ratio. The mixture is heated and melted entirely, and then cooled gradually. Examples of preferred lead compounds include lead monoxide, lead tetroxide, and lead fluoride. Among other things, lead monoxide is particularly preferred because the compound is relatively easy to handle. As for the boron compound, $H_3BO_3$ or $B_2O_3$ may be used, for example. Examples of preferred Ce compounds include $CeO_2$, $Ce(OH)_3$, and $Ce_2O_3$. Of these three compounds, $CeO_2$ and $Ce_2O_3$ are particularly preferred because these compounds are sold in bulk as high purity products and are easily available anytime. And as for the Lu compound, $Lu_2O_3$ is preferably used.

To adjust the melting point or the viscosity or blow the bubble of the melt, the solvent may include at least one alkaline earth metal or alkaline metal compound selected from the group consisting of $BaCO_3$, $CaCO_3$, $Na_2O$ and $Li_2O$.

These starting materials are prepared at the following ratio. First of all, the boron compound and the lead compound are mixed together so that 0.2 to 1.6 mol of B is included for 1 mol of Pb to obtain a solvent. To deposit an even bigger crystal, the boron compound and the lead compound are more preferably mixed together so that 0.7 to 1.4 mol of B is included for 1 mol of Pb. Optionally, the solvent may include at least one alkaline earth metal or alkaline metal compound selected from the group consisting of $BaCO_3$, $CaCO_3$, $Na_2O$ and $Li_2O$. In the following description, such at least one compound will be referred to herein as "$BaCO_3$, etc." If BaCO3, etc. is added to the solvent, the additive is preferably introduced so that at most 5.0 mol of $BaCO_3$, etc. is included for 1 mol of Pb. Then, the Lu compound and the Ce compound are added to the solvent so that 0.02 to 0.3 mol of Lu compound is included for 1 mol of Pb and that 0.01 to 5 mol of Ce compound is included for 1 mol of Lu. As the mixture of these materials is heated, the compounds added to the solvent are melted, and the Lu and Ce compounds are dissolved in the molten solvent. Optionally, lead borate, lutetium borate and so on that have been separately prepared in advance as starting materials may be mixed together at the ratio described above.

Next, that mixture is heated to a temperature that is equal to or higher than 800° C. but equal to or lower than 1,350° C. (that is the phase transition point of lutetium borate) at a temperature increase rate of 50° C. per hour to 500° C. per hour, and then held at that temperature for 1 to 12 hours, thereby melting the mixture entirely. Alternatively, the mixture could be once heated to a temperature exceeding that range and then held within the temperature range described above. $LuBO_3$ has a melting point of 1,650° C. but will get dissolved in the solvent that has melted at a temperature falling within this temperature range, which is lower its melting point.

Subsequently, the molten and dissolved mixture is gradually cooled preferably at a temperature decrease rate of at least 0.001° C. per hour, more preferably at a rate of 0.01° C. per hour, and even more preferably at a rate of 0.1° C. per hour to 30° C. per hour. To grow a crystal to an even bigger size, the mixture is preferably gradually cooled at a rate of 0.001° C. per hour to 5° C. per hour, more preferably at a rate of 0.003° C. per hour to 2° C. per hour, until the temperature of the mixture reaches the range of 750° C. to 1,250° C. By slowly cooling the mixture at such a low rate, the crystal deposited can be grown thickly. Optionally, the mixture could be held halfway at a temperature falling within the range of 800° C. to 1,250° C. for half an hour or more to grow the crystal thickly. After having been gradually cooled this way (i.e., to less than a gradual cooling stop temperature falling within the range of 800° C. to 1,250° C.), the mixture may be rapidly cooled at a relatively high temperature decrease rate of 50° C. per hour to 300° C. per hour.

The mixture melted does not have to stop being gradually cooled at a temperature falling within the range of 800° C. to 1,250° C. but may continue being gradually cooled until its temperature reaches the range of 500° C. to 800° C. In that case, until its temperature reaches the range of 500° C. to 800° C., the mixture is preferably gradually cooled at a temperature decrease rate of at least 0.01° C. per hour, more preferably at a rate of 0.1° C. per hour to 20° C. per hour. Even so, after having been gradually cooled that way, the mixture may also be rapidly cooled at a relatively high temperature decrease rate of 50° C. per hour to 300° C. per hour.

The solvent solidified has been deposited on the single crystal that has just been raised from the crucible. That is why a single crystal of cerium doped lutetium borate being withdrawn is separated from the solvent by immersing it in hydrochloric acid, acetic acid, nitric acid, or an aqueous solution thereof. Optionally, before the single crystal is separated this way, the solvent melted may be removed by heating the single crystal again to a temperature of 500° C. to 700° C. Also, while being cooled to grow and deposit the single crystal, the mixture may be held at a temperature of 500° C. to 700° C. (e.g., 550° C.) for several hours (e.g., five hours).

Examples of specific preferred crystal growing methods include a flux method (which is a kind of gradual cooling process and also called a "temperature difference method"), the Bridgman process and the TSSG (top seeded solution growth) method. According to the TSSG method, a big crystal can be grown and the crystal grown can be separated easily from the solution. Hereinafter, it will be described with reference to FIG. 4 specifically how to grow a crystal by TSSG method.

Figure 4:
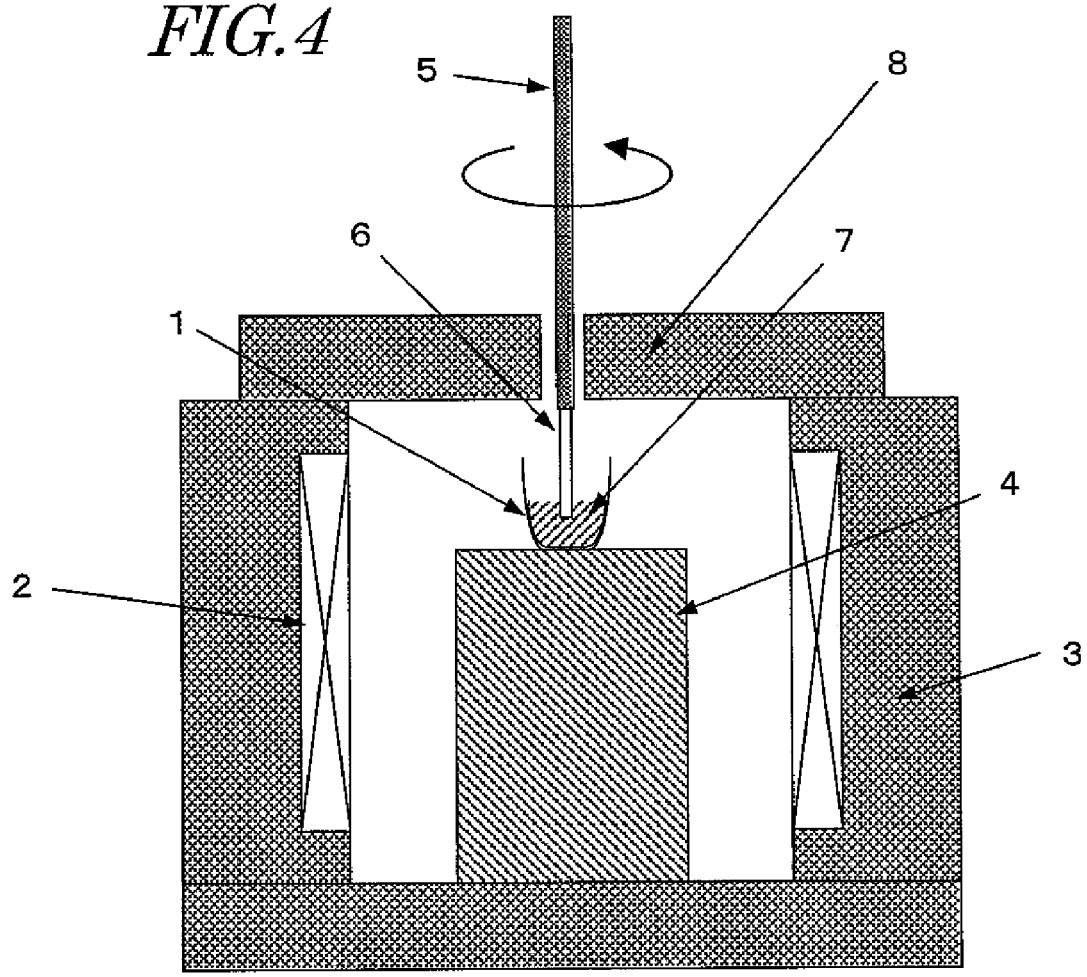
FIG. 4 illustrates a crystal grower that was used to carry out the present invention.

FIG. 4 illustrates a crystal grower for use to carry out the TSSG method. The apparatus shown in FIG. 4 includes an electric furnace 3, of which the temperature can be controlled with a heater 2. As shown in FIG. 4, a crucible 1 of platinum, containing a molten material 7, has been put on a crucible susceptor 4 inside the electric furnace 3. The apparatus with such a configuration dissolves the material, which has been prepared and then introduced into the crucible 1, by heating the material with the heater 2. A seed material 6 that has been put at the top of a seed shaft 5 is brought into contact with the molten material 7 and then either held there or raised to grow a crystal. As for the seed material 6, a crystal of the same kind as the crystal to grow is generally and preferably used. However, a different kind of crystal that is not easily dissolved in the molten material 7 or platinum, for example, is also used often as the seed material 6.

A single crystal of cerium doped lutetium borate obtained by such a manufacturing process is a hexagonal plate single crystal, of which the transmittance at a peak of its emission wavelength is 50% or more, and has a calcite structure. When excited with an X-ray, the single crystal has a peak of emission wavelength of 365 nm to 410 nm and produces an emission, of which the intensity is 300% or more compared to BGO with the same volume. Also, when excited with a γ ray produced from a $^{137}Cs$ ray source, the single crystal has a fluorescence decay time of 25 nsec or less, which is much shorter than 300 nsec that is the decay time of BGO.

EXAMPLES

Example 1

In a first specific example of the present invention, a crystal was grown by the flux method (which is a kind of gradual cooling process). A crucible of platinum with a diameter of 50 mm and a depth of 60 mm was provided. Meanwhile, 100 g of PbO, 18 g of $B_2O_3$, 8 g of $Lu_2O_3$, and 0.1 g of $CeO_2$ were weighted and mixed together in a mortar, and then the mixture was put into the crucible. Then, the crucible of platinum was loaded into a crucible of alumina with a diameter of 60 mm and a depth of 70 mm. And the alumina crucible was capped to grow a crystal according to the heat pattern shown in FIG. 1, in which the ordinate represents the temperature and the abscissa represents the time. The middle phase of the cooling process is not shown there.

According to this specific example, the temperature was first increased to 450° C. at a rate of 210° C. per hour, increased next to 800° C. at a rate of 100° C. per hour, and then increased to 1,300° C. at a rate of 135° C. per hour. After the mixture was held at 1,300° C. for 2 hours, its temperature was decreased to 700° C. at a rate of 25° C. per hour and then continued to be decreased at a rate of 75° C. per hour, as can be seen from FIG. 1.

From the mixture that had been melted and dissolved at a temperature of around 1,300° C., a crystal represented by the compositional formula $(Ce_xLu_{1-x})BO_3$ has grown by cooling.

After having cooled, the crystal in the crucible was heated again to 700° C., thereby melting the solvent that had solidified in the crucible and removing it from the crucible. Thereafter, the crucible was rinsed with hydrochloric acid and then the crystal remaining in the crucible was unloaded.

Figure 2:
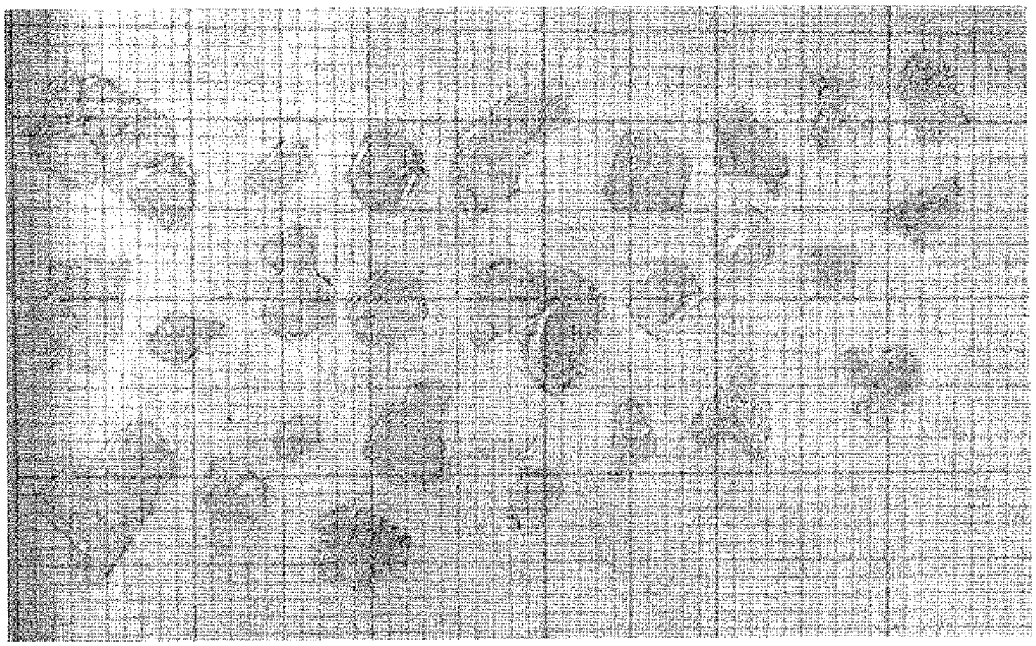
FIG. 2 is a photograph showing crystals that were grown by the method of the first specific example of the present invention.

FIG. 2 is a photograph showing a lot of crystals thus obtained. In FIG. 2, a grid is illustrated to indicate the sizes of those crystals, and the grid spacing (i.e., the size of each grid square) is 1 mm. As can be seen easily from FIG. 2, most of these crystals had a diagonal size of at least 4 mm and a thickness of at least 0.6 mm. Each of those crystals had a weight of at least 50 mg.

Figure 3:
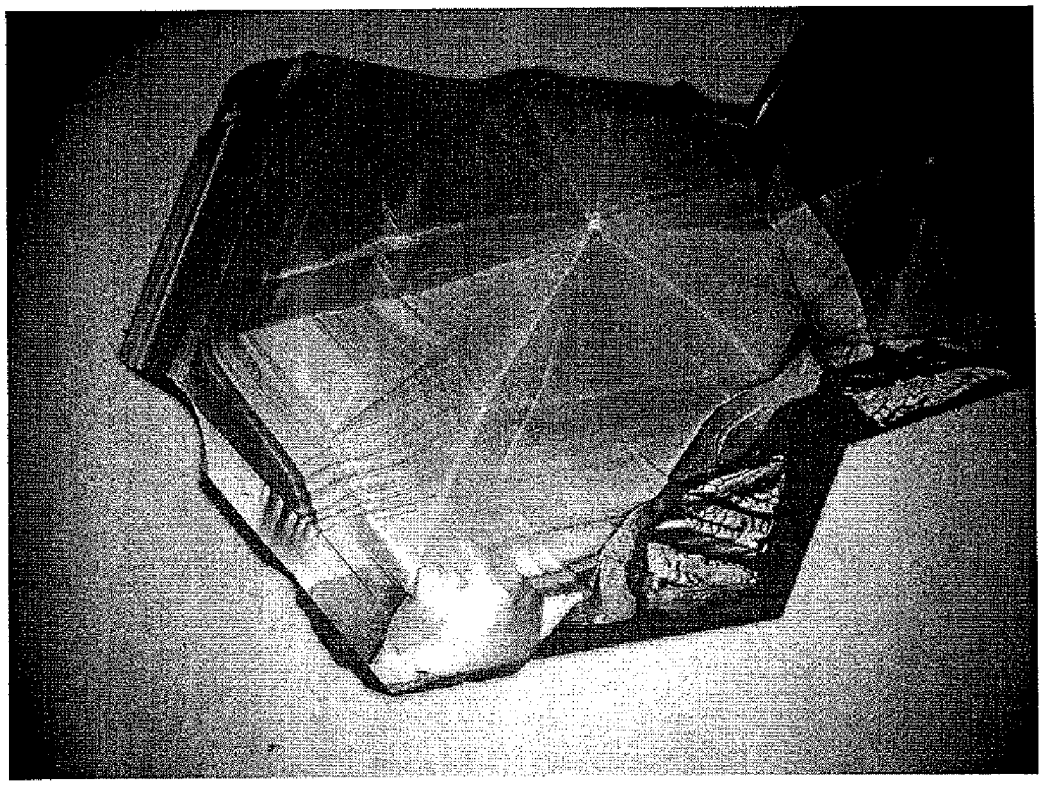
FIG. 3 is a photograph showing one of the crystals in FIG. 2 on a larger scale.

FIG. 3 is a photograph showing one of those crystals on a larger scale. This crystal was a generally hexagonal plate single crystal.

Each of those crystals thus obtained was subjected to a measurement using an X-ray diffractometer. As a result, the present inventors confirmed that the crystal had a $LuBO_3$ calcite structure. Also, the Ce concentration with respect to the sum of the rare-earth elements included in the crystal thus obtained was measured by mapping using an electron probe microanalyzer (EPMA). As a result, we confirmed that the Ce concentration was 0.1 at % or more in every region. That is to say, the Ce mole fraction x in the compositional formula $(Ce_xLu_{1-x})BO_3$ was 0.001, which satisfied the inequality $0.0001 \leq x \leq 0.05$.

Furthermore, the crystal as a specific example of the present invention was excited with an X-ray radiated from a CuKα ray source so as to produce an emission. As a result, the peak of emission wavelength was 365 nm. Also, the intensity of the emission produced by this specific example was 320% of that of the emission produced by BGO with the same volume, which was a $Bi_4Ge_3O_{12}$ single crystal that had been grown by Bridgman process and had a density of 7.14 g/cm$^3$. Also, when excited with a γ ray radiated from a $^{137}$Cs ray source, the crystal of this specific example had a fluorescence decay time of 21 nsec. On the other hand, the BGO had a fluorescence decay time of 300 nsec.

Example 2

In a second specific example of the present invention, a crystal was grown by the TSSG method using the apparatus shown in FIG. 4. A crucible 1 of platinum with a diameter of 40 mm and a depth of 50 mm was provided. Meanwhile, 100 g of PbO, 18 g of $B_2O_3$, 10 g of $Lu_2O_3$, and 0.1 g of $CeO_2$ were weighted and mixed together in a mortar, and then the mixture was put into the crucible. Then, with the temperature of the crucible 1 controlled with a heater 2 surrounding the crucible 1, a crystal was grown according to the heat pattern shown in FIG. 5, in which the ordinate represents the temperature and the abscissa represents the time. The middle phase of the cooling process is not shown there, either.

Figure 5:
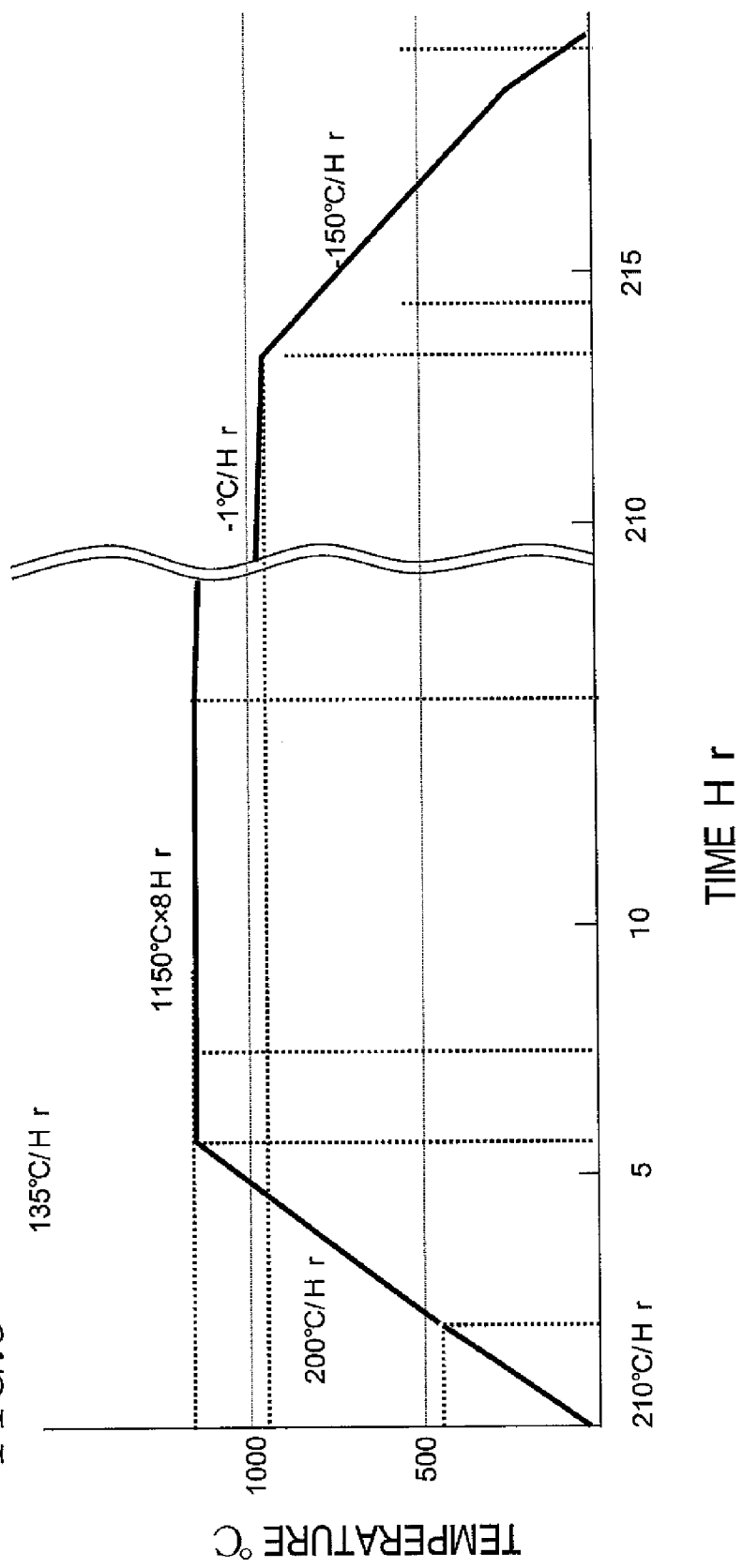
FIG. 5 is a graph showing a heat pattern for growing a crystal according to a second specific example of the present invention.

As can be seen from FIG. 5, the temperature of this specific example was first increased to 450° C. at a rate of 210° C. per hour, increased next to 1,150° C. at a rate of 200° C. per hour, and then held at that temperature for two hours. Next, the seed material 6 that was put at the top of the seed shaft 5 being rotated at a frequency of 30 rpm (and which was a platinum plate with a width of 5 mm and a thickness of 0.5 mm) was brought down from over the crucible into contact with the surface of the molten material. After the seed material 6 had been held there for six more hours, its temperature was decreased to 950° C. at a rate of 1° C. per hour. Thereafter, the platinum plate was withdrawn from the surface of the molten material by raising the seed shaft 5 and then its temperature was further decreased at a 150° C. per hour.

At the top of the platinum plate that had been in contact with the molten material, a crystal represented by the compositional formula $(Ce_xLu_{1-x})BO_3$ had grown.

After having been cooled, the platinum plate and the crystal grown were rinsed with hydrochloric acid to remove the solvent deposited there. And then the crystal was unloaded.

Figure 6:
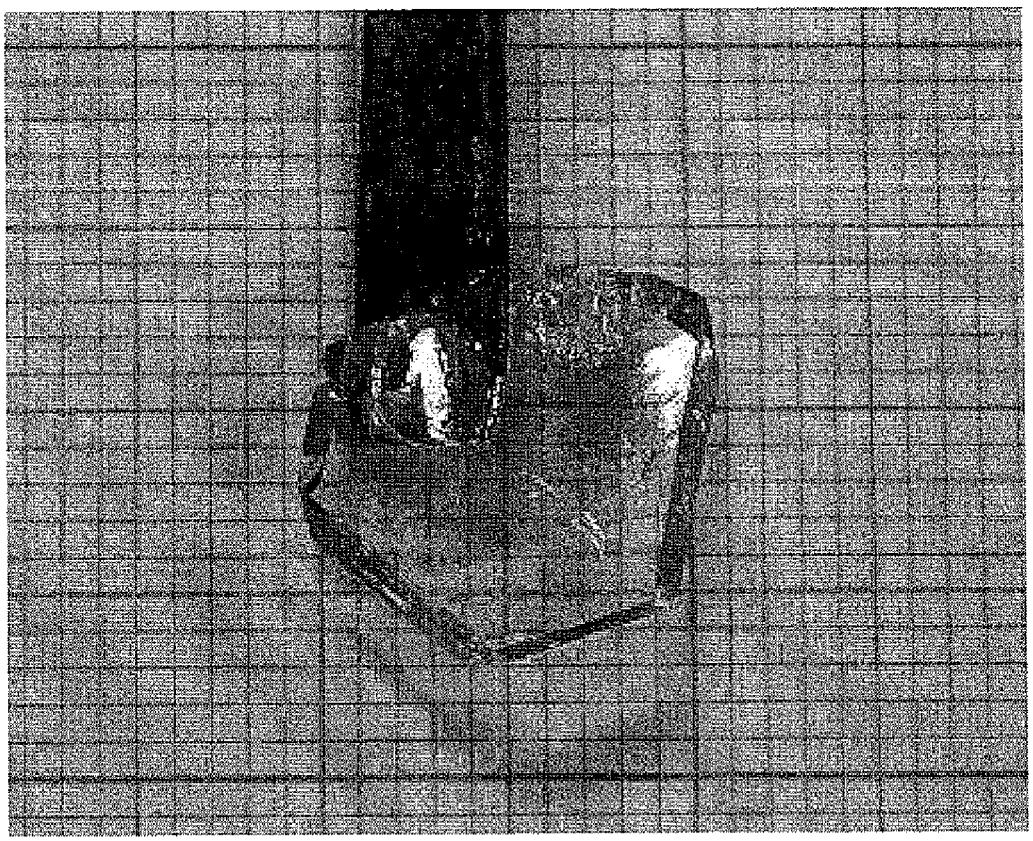
FIG. 6 is a photograph showing a crystal that was grown by the method of the second specific example of the present invention.

FIG. 6 is a photograph showing a crystal thus obtained. In FIG. 6, a grid is illustrated to indicate the size of the crystal, and the grid spacing (i.e., the size of each grid square) is 1 mm. As can be seen easily from FIG. 6, this crystal had a diagonal size of 10 mm or more, a thickness of 1.2 mm or more, and a weight of 800 mg or more. Thus, according to this specific example, a crystal with a weight of more than 500 mg could be obtained.

The crystal thus obtained was subjected to a measurement using an X-ray diffractometer. As a result, the present inventors confirmed that the crystal had a $LuBO_3$ calcite structure. Also, the Ce concentration with respect to the sum of the rare-earth elements included in the crystal thus obtained was measured with an electron probe microanalyzer (EPMA). As a result, we confirmed that the Ce concentration was 0.05 at % or more in every region. That is to say, the Ce mole fraction x in the compositional formula $(Ce_xL_{1-x})BO_3$ was 0.0005, which satisfied the inequality $0.0001 \leq x \leq 0.05$.

Furthermore, the crystal as a specific example of the present invention was excited with an X-ray radiated from a CuKα ray source so as to produce an emission. As a result, the peak of emission wavelength was 365 nm. Also, when excited with a y ray radiated from a $^{137}$Cs ray source, the crystal of this specific example had a fluorescence decay time of 21 nsec.

INDUSTRIAL APPLICABILITY

A cerium doped lutetium borate single crystal scintillator material according to the present invention has such a short fluorescence decay time and exhibits such good scintillator properties as to be used effectively to make a PET scanner.

The invention claimed is:
1. A single crystal scintillator material comprising a single crystal portion that is represented by the compositional formula $(Ce_xLu_{1-x})BO_3$ in which the mole fraction x of Ce satisfies $0.0001 \leq x \leq 0.05$.

2. The single crystal scintillator material of claim 1, wherein the single crystal portion has a calcite type crystal structure.

3. The single crystal scintillator material of claim 1, wherein the single crystal portion has a diagonal size of at least 3 mm and a thickness of at least 0.5 mm.

4. The single crystal scintillator material of claim 1, wherein the single crystal portion has a weight of at least 5 mg.

5. The single crystal scintillator material of claim 4, wherein the single crystal portion has a weight of 500 mg or more.

6. A positron emission tomography scanner comprising a scintillator made of the single crystal scintillator material of claim 1.

7. A method of making a single crystal scintillator material, the method comprising the steps of:

mixing a Ce compound and a Lu compound in a solvent, which includes lead borate as main component, so that the concentration of the compounds becomes equal to or higher than the saturation concentration of the solvent and then heating the mixture to a temperature of 800° C. to 1,350° C., thereby dissolving the compounds; and growing and depositing a single crystal by cooling the compounds dissolved, the single crystal being represented by the compositional formula $(Ce_xLu_{1-x})BO_3$, in which the mole fraction x of Ce satisfies $0.0001 \leqq x \leqq 0.05$.

8. The method of claim 7, wherein the step of growing and depositing the single crystal is performed by TSSG process.

9. The method of claim 7, wherein the step of growing and depositing the single crystal includes cooling the mixture at a temperature decrease rate of 0.001° C. per hour to 5° C. per hour until the temperature of the compounds reaches the range of 750° C. to 1,250° C.

10. The method of claim 7, wherein the single crystal is grown to have a diagonal size of at least 3 mm and a thickness of at least 0.5 mm.

* * * * *